US006239653B1

(12) United States Patent
Rezzi et al.

(10) Patent No.: US 6,239,653 B1
(45) Date of Patent: *May 29, 2001

(54) BIQUADRATIC BASIC CELL FOR PROGRAMMABLE ANALOG TIME-CONTINUOUS FILTER

(76) Inventors: Frencesco Rezzi, Via S. Pietro in Verzolo, 20/A, I-27100 Pavia; Rinaldo Castello, Via Golgi, 13, I-20043 Arcore (Milano); Marco Cazzaniga, c/o SGS-Thomson Microelectronics S.r.L. Via C. Olivetti, 2, 20041 Agrate Brianza (Milano); Ivan Bietti, Via Fossa Regia, 48, I-46040 Casalromano (Mantova), all of (IT)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/984,107

(22) Filed: Dec. 3, 1997

(30) Foreign Application Priority Data

Dec. 4, 1996 (EP) .................................................. 96830603

(51) Int. Cl.$^7$ ........................................................ H03K 5/00
(52) U.S. Cl. ..................... 327/552; 327/103; 327/553; 327/341; 327/563; 330/303; 330/252
(58) Field of Search ...................................... 327/552, 560, 327/341, 103, 553, 65, 63, 563; 330/253, 254, 252, 303, 305

(56) References Cited

U.S. PATENT DOCUMENTS 5,081,423 * 1/1992 Koyama et al. ....................... 327/341

5,559,470 * 9/1996 Laber et al. .......................... 330/252

FOREIGN PATENT DOCUMENTS 0 579 875   1/1994 (EP) .............................. H03H/11/04

OTHER PUBLICATIONS

European Search Report from European Patent Application 96830603.5, filed Dec. 4, 1996.
Proceedings Of The International Symposium on Circuits And Systems (ISCS), Chicago, May 3–6, 1993, Institute Of Electrical and Electronics Engineers, pp. 1447–1450, Stevaert M., et al., "Low–Voltage Analog CMOS Filter Design".

* cited by examiner

Primary Examiner—Dinh T Le

(57) ABSTRACT

The invention relates to an elementary biquadratic cell for programmable time-continuous analog filters. The biquadratic cell is coupled between a first voltage reference and a second voltage reference and has at least one pair of input terminals and first and second pairs of output terminals. The cell includes a pair of half-cells, which half-cells are structurally identical with each other. Each half-cell comprises at least a first transistor coupled between the first and the second voltage reference and having a base terminal connected to a respective one of the input terminals. Each half-cell further comprises second and third transistors coupled between the first and second voltage references. The second transistor has a base terminal connected to the first output terminal of the first pair of output terminals and a collector terminal connected to the first output terminal of the second pair of output terminals. The third transistor has a collector terminal connected to the first output terminal of the first pair of output terminals and a base terminal connected to the second output terminal of the second pair of output terminals.

31 Claims, 4 Drawing Sheets

BIQUADRATIC BASIC CELL FOR PROGRAMMABLE ANALOG TIME-CONTINUOUS FILTER

BACKGROUND OF THE INVENTION

1. Field of the Invention

This invention relates to an elementary biquadratic cell for programmable time-continuous analog filters.

2. Discussion of the Related Art

Reference will be made hereinafter in particular, but not exclusively, to signal analog filters for applications related to the reading phase of data from mass memories (also referred to in the technical literature as 'disk-drive applications'). In this field, the filter cutoff frequencies referred to herein are currently on the order of 50 to 100 MHZ. As is well known, the provision of integrated electronic filters in high-frequency applications cause some problems in using filtering techniques which employ configurations of feedback operational amplifiers intended to provide a desired transfer function. In fact, the frequency limitations of operational amplifiers appear as parasitic single points in the filter transfer function, and this limits the filter performance. These problems can be circumvented at certain frequencies by using open ring configurations, such as filters formed by transconductors and capacitors, referred to as gm/C's for brevity.

Most analog filters can be formed by elementary cells of the low-pass type. For example, FIG. 1 shows a biquadratic cell 10 according to the prior art. The cell 10 has first, second, third and fourth differential transconductors 1–4, connected in parallel together between a pair of input terminals I1, I2 and a pair of output terminals O1, O2 of the biquadratic cell 10. Each differential transconductor, 1, 2, 3 and 4, has a respective transconductance value gm1, gm2, gm3 and gm4, and has first and second input terminals, I+ and I−, and first and second output terminals, O+ and O−, respectively.

The first and second differential transconductors 1 and 2 have their output terminals connected to a voltage reference, specifically a signal ground GND, through a first pair of capacitors, C1 and C1', and through a second pair of capacitors C2 and C2', respectively. Also, the third and fourth differential transconductors 3 and 4 have their output terminals feedback connected to the output terminals of the second 2 and the first 1 differential transconductor 4, respectively. From a functional standpoint, the fourth differential transconductor 4, and the first capacitor pair C1, C1', operate as a pure integrator, whereas the second and third differential transconductors 2 and 3, and the second capacitance pair C2, C2' operate as a damped integrator.

It should be noted that the third differential transconductor 3, being closed into a unitary feedback, is equivalent to a resistor having a value of $1/gm^3$. In addition, the first differential transconductor 1 provides the needed voltage-to-current conversion at the input of the biquadratic cell 10.

Each differential transconductor 1, 2, 3 and 4 is implemented as a symmetrical differential structure, shown in FIG. 2.

In particular, the differential transconductor 1 of FIG. 1 is shown in FIG. 2, for example, which is coupled between a supply voltage reference Vdd and the ground GND. The differential transconductor 1 has a pair of input terminals I+ and I− and a pair of output terminals O+ and O−, its structure being symmetrical with respect to an internal node X.

The differential transconductor 1 includes respective bias current generators G1 and G2 which are respectively coupled between the supply voltage reference Vdd and respective bipolar transistors T1 and T2, the latter having their base terminals respectively connected to the input terminals I− and I+ and their collector terminals respectively connected to the output terminals O− and O+. The differential transconductor 1 further includes respective resistors R1, R2 of same value R, which are respectively coupled between the emitter terminals of the bipolar transistors T1, T2 and the internal node X, the latter being connected to the ground GND through a common bias current generator GC. In particular, these resistors R1, R2 may advantageously be MOS transistors working in their linear zone.

The differential structure of the transconductor 1 of FIG. 2 allows the equivalent transconductance value Gmeq of the differential transconductor 1 to be varied by changing the value R of the resistors R1 and R2; the Gmeq value being given by the following equation:

$$Gmeq = gmbip/(1 + gmbip*R) \qquad (1)$$

where R is the value of the resistors R1 and R2; and gmbip is the transconductance value of the bipolar transistors T1 and T2.

Thus, by using resistors R1, R2 formed of MOS transistors, the value R can be varied in a simple manner by changing a tuning current for such MOS transistors.

It should be noted that the current draw of a biquadratic cell is the same as that of four differential transconductors, which transconductors must be dimensioned to suit the linear performance required for a given dynamic range of the signals to be processed. In fact, since the behavior of the transconductor stages cannot be linearized by the provision of appropriate feedback loops, the input signal is only required to modulate a small fraction of the current at rest through the active components, including essentially the bipolar transistors.

For example, for an input dynamic range of 400 differential mVp-p and a 1% distortion of the current output from the transconductor stage, the product gmbip*R of Equation 1 should correspond to a value of six, meaning that the differential transconductor has a degeneration of 150 mV relative to the bipolar transistor. When minimal capacitances C1, C2, i.e. capacitances in the picoFarad range, are used in order to have the parasitic capacitances adequately controlled, currents in the mA range must be used for each differential transconductor to provide comparable time constants with those normally used in such applications.

It must also be noted that the differential transconductor distortion is unrelated to the frequency of the signals being processed. That is, the current within the bipolar transistors incorporated into the differential transconductors is modulated, even for low frequency signals, to produce a variation in their transconductance values and, hence, a distortion in the output current.

The underlying technical problem which is addressed by this invention is the problem of providing a biquadratic cell structure adapted to form continual time filters having such structural and functional features to decrease the power dissipation through the filter, while retaining the performance level, in terms of dynamic speed, of the processed signal and the total harmonic distortion (THD) of the prior art filter.

SUMMARY OF THE INVENTION

The present invention provides a biquadratic cell which has a symmetrical structure and a smaller number of bias branches than conventional ones, and at the same time reduces the current-flowing through each bias branch.

According to one aspect of the invention, an elementary biquadratic cell for programmable time-continuous analog filters is disclosed. The biquadratic cell is coupled between a first voltage reference and a second voltage reference and has at least one pair of input terminals and first and second pairs of output terminals. The cell includes a pair of half-cells, which half-cells are structurally identical with each other. Each half-cell comprises at least a first transistor coupled between the first and the second voltage reference and having a base terminal connected to a respective one of the input terminals. Each half-cell further comprises second and third transistors coupled between the first and second voltage references. The second transistor has a base terminal connected to the first output terminal of the first pair of output terminals and a collector terminal connected to the first output terminal of the second pair of output terminals. The third transistor has a collector terminal connected to the first output terminal of the first pair of output terminals and a base terminal connected to the second output terminal of the second pair of output terminals.

According to another aspect of the invention, an elementary biquadratic cell is disclosed, the cell having first and second input terminals and first, second, third and fourth output terminals. The cell comprises first and second half cells, the first cell comprising a first transistor having a collector terminal coupled to a first supply voltage, an emitter terminal coupled to a second supply voltage and a base terminal coupled to the first input terminal, a second transistor having a collector terminal coupled to the first output terminal, an emitter terminal coupled to the second supply voltage and a base terminal coupled to the second output terminal and a third transistor having a collector terminal coupled to the second output, an emitter terminal coupled to the second supply voltage and a base terminal coupled to the third output terminal.

The second half-cell comprises a fourth transistor having a collector terminal coupled to the first supply voltage, an emitter terminal coupled to the second supply voltage and a base terminal coupled to the second input terminal, a fifth transistor having a collector terminal coupled to the third output terminal, an emitter terminal coupled to the second supply voltage and a base terminal coupled to fourth output terminal and a sixth transistor having a collector terminal coupled to the fourth output terminal, an emitter terminal coupled to the second supply voltage and a base terminal coupled to the first output terminal.

According to another aspect of the invention, an elementary biquadratic cell for programmable time-continuous analog filters is disclosed, the cell comprising a pair of input terminals for receiving an input signal and first and second pairs of output terminals. An output at the first pair of output terminals is of a low-pass type and an output at the second pair of output terminals is of a band pass type. The cell comprises a first half cell and a second half-cell, wherein the first half-cell comprises a first input terminal of the pair of input terminals, a first output terminal of the first pair of output terminals and a first output terminal of the second pair of output terminals. The second half-cell comprises a second input terminal of the pair of input terminals, a second output terminal of the first pair of output terminals and a second output terminal of the second pair of output terminals.

The features and advantages of the invention will be apparent from the following description of embodiments thereof, given by way of illustration and not of limitation with reference to the accompanying drawings.

DETAILED DESCRIPTION

Figure 3:
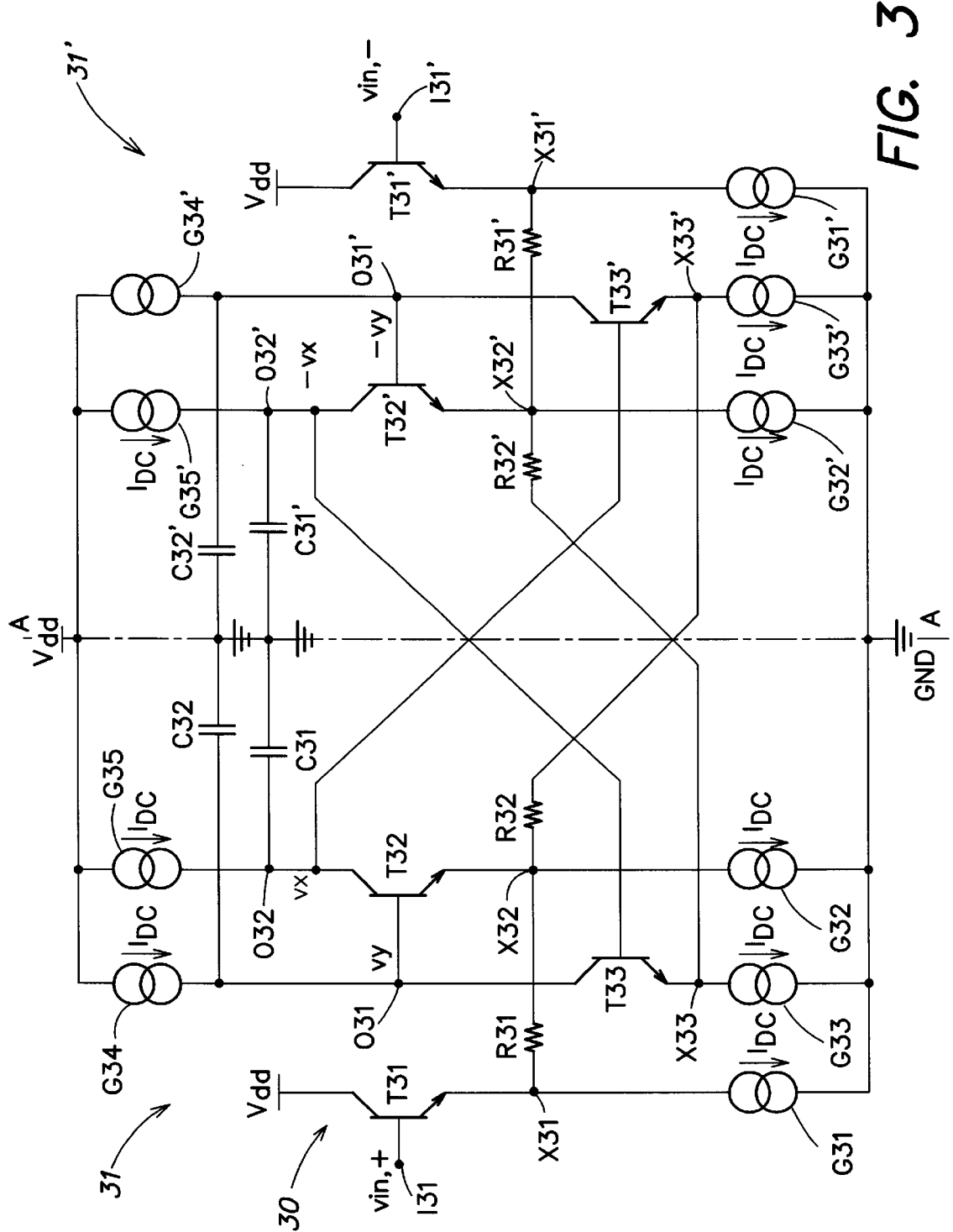
FIG. 3 shows schematically a biquadratic cell according to the present invention.

Referring in particular to FIG. 3, generally and schematically shown at 30 is a biquadratic cell according to the invention. This cell is particularly, though not exclusively, intended for implementing programmable time-continuous analog filters.

The cell 30 is placed between a first supply voltage reference Vdd and a second voltage reference, specifically a signal ground GND, and is a symmetrical structure about an imaginary axis A—A. The cell 30 can be viewed as being split, at this axis A—A, into two half-cells 31 and 31', which are identical with each other and respectively connected to a pair of input terminals I31 and I31', and to a first pair of output terminals O31 and O31' and a second pair of output terminals O32 and O32' of the biquadratic cell 30.

The first half-cell 31 comprises a first bipolar transistor T31, placed between the supply voltage reference Vdd and a first circuit node X31 and having a base terminal connected to the input terminal I31. The first circuit node X31 is also connected to the ground GND through a first bias current generator G31, and to a second circuit node X32 through a first resistor R31. The second circuit node X32 is connected to the ground GND through a second bias current generator G32.

The first half-cell 31 comprises a second bipolar transistor T32, which is connected between the second circuit node X32 and the second output terminal O32 and has a base terminal connected to the first output terminal O31. First half-cell 31 also comprises a third bipolar transistor T33, which is connected between the first output terminal O31 and a third circuit node X33, which is also connected to the ground GND through a third bias current generator G33. The first and second output terminals O31 and O32 are further connected to the supply voltage reference Vdd through fourth and fifth bias current generators G34 and G35. The first half-cell 31 also comprises first and second integration capacitors C31 and C32, respectively connected between the first and second output terminals 031 and 032 and the ground GND.

The structure of the second half-cell 31' is identical and symmetrical with that of the first half-cell 31 just described; accordingly, not to overburden this description, no detailed description thereof will be provided herein, except that corresponding elements to those of the first half-cell 31 are denoted in the figure by the same references numerals and characters with a prime (') added.

The first half-cell 31 and second half-cell 31' are suitably connected to each other. In particular, the collector terminal of the second bipolar transistor T32 in the first half-cell 31, corresponding to the second output terminal O32 of the cell 30, is connected to the base terminal of the third bipolar transistor T33' of the second half-cell 31'. Conversely, the collector terminal of the second bipolar transistor T32' in the second half-cell 31', corresponding to the second output terminal O32' of the cell 30, is connected to the base terminal of the third bipolar transistor T33 in the first half-cell 31.

In addition, the emitter terminal of the third bipolar transistor T33 in the first half-cell 31, corresponding to the third circuit node X33, is connected to the emitter terminal of the second bipolar transistor T32' in the second half-cell 31', corresponding to the second circuit node X32', through a second resistor R32'. Conversely, the emitter terminal of the third bipolar transistor T33' in the second half-cell 31', corresponding to the third circuit node X33', is connected to the emitter terminal of the second bipolar transistor T32 in the first half-cell 31, corresponding to the second circuit node X32, through a second resistor R32.

The main features of the resulting biquadratic cell 30 can be summarized as follows:
 (i) each half-cell, 31 and 31', has three bias branches only, compared to the four required to implement a corresponding half-cell according to the prior art;
 (ii) the bias currents flowing through the bipolar components of the biquadratic cell 30 can be reduced substantially compared to the prior art; and
 (iii) the transistor bias currents are only modulated by the high-frequency components (therefore, already filtered by the cell itself) of the input signal.

Feature (ii) is provided by adding together the currents for the various transconductors being effected at the emitter terminals, rather than the collector terminals as in a biquadratic cell according to the prior art, so that the differential transconductors of the biquadratic cell will only be charged capacitively.

The transfer function of the biquadratic cell 30 in FIG. 3, as simplified by putting gmbip*R>>1, is given by:

$$\frac{vy}{vin} = \frac{1}{s^2 \cdot C_1 \cdot C_2 \cdot R_1 \cdot R_2 + s \cdot R_1 \cdot (C_2 - C_1) + 1} \quad (2.1)$$

$$\frac{vx}{vin} = \frac{1 + s \cdot R_2 \cdot C_1}{s^2 \cdot C_1 \cdot C_2 \cdot R_1 \cdot R_2 + s \cdot R_1 \cdot (C_2 - C_1) + 1} \quad (2.2)$$

where, vin is the input voltage received at the input terminals I31, I31';
vx and vy are the output voltages respectively delivered on the first output terminals O31 and O31' and the second output terminals O32 and O32';
$C_1$ and $C_2$ are the respective values of each of the first capacitors C31 and C31' and the second capacitors C32 and C32'; and
$R_1$ and $R_2$ are the values of each of the first resistors R31 and R31' and second resistors R32 and R32', respectively.

Where gmbip*R is not much greater than one, the transfer function becomes complicated, but remains a transfer function of a biquadratic cell with outputs of the low-pass type, like that defined by the above relationships (2.1) and (2.2).

However, the biquadratic cell 30 experiences a positive common mode feedback, which restricts its use to applications having a high common mode gain and a wide band.

Figure 4:
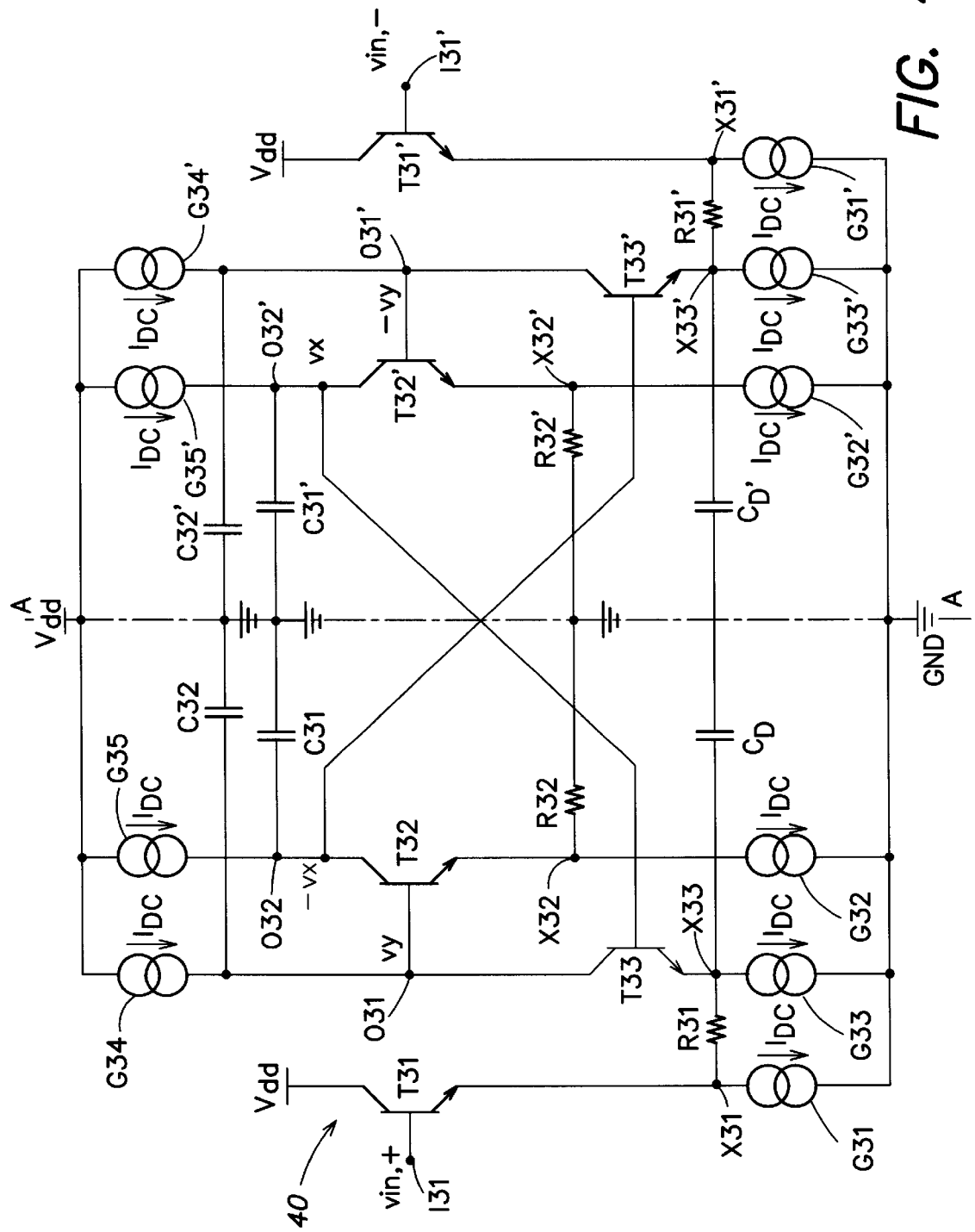
FIG. 4 shows a modified embodiment of the biquadratic cell of FIG. 3.

Shown in FIG. 4 is a biquadratic cell 40 which overcomes the positive common mode feedback of the biquadratic cell 30, but still enjoys its beneficial features by merely providing for a partial modification of its circuit topology. For this biquadratic cell 40, all the corresponding elements to those of the cell 30 are denoted in FIG. 4 by the same reference numerals and characters as in FIG. 3.

Compared to the cell 30, the first resistors R31 and R31' are respectively placed between the emitter terminals of the first bipolar transistors T31 and T31' and the third bipolar transistors T33 and T33', while the second resistors R32 and R32' are connected, in series with each other, between the emitter terminals of the second bipolar transistors T32 and T32'. In addition, the biquadratic cell 40 comprises respective damping capacitors CD, CD' connected between the emitter terminals of the third bipolar transistors T33, T33' and the ground GND.

In particular, the biquadratic cell 40 will effect, in operation, a capacitive rather than resistive damping, through the capacitors CD and CD' having the same value Cd. These capacitors actually add a zero to the frequency response gm/(2π*Cd) in the frequency response of one of the transconductors (having a transconductance gm).

Figure 1:
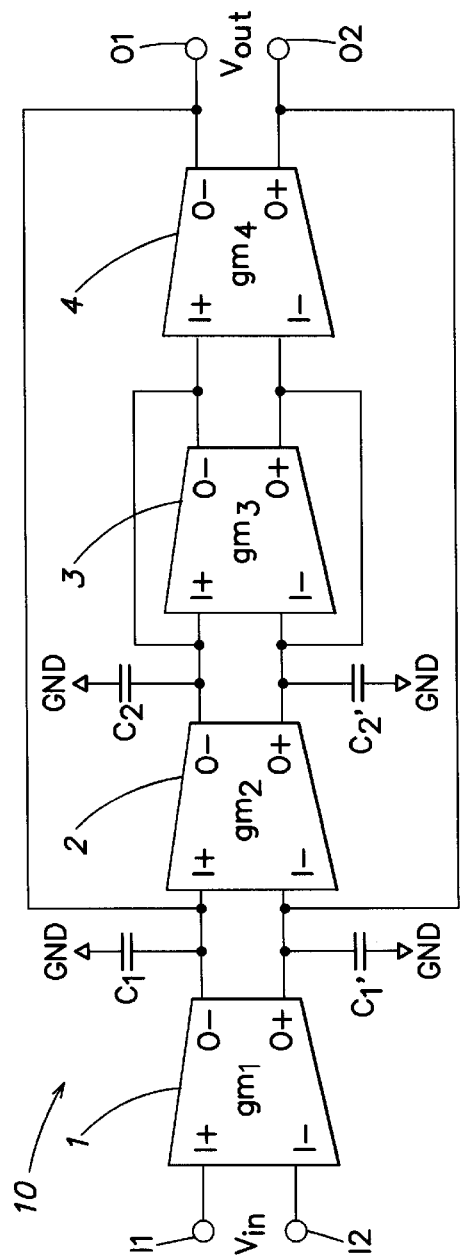
FIG. 1 shows schematically a biquadratic elementary cell of the low-pass type, according to the prior art.
Figure 2:
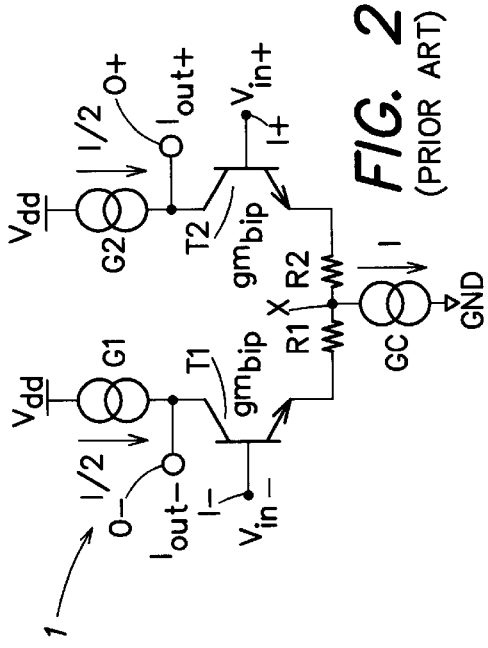
FIG. 2 shows schematically a differential transconductor included in the biquadratic cell of FIG. 1.

The resulting integrator shows a phase delay at its unit gain frequency, equal to gm/(2π*Cd). This phase delay corresponds to the phase delay of a transconductor having a transconductance gm and which is charged from a resistor with a value of $1/gm^3$, of the type shown in FIG. 1, so long as the following relationship holds:

$$\frac{gm}{gm^3} = \frac{C}{Cd}.$$

Figure 5A:
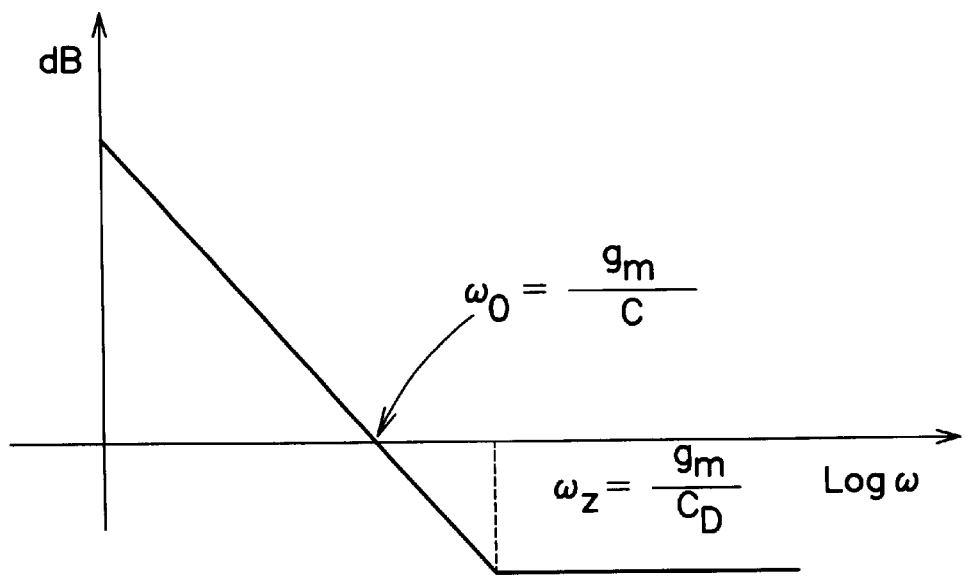
FIGS. 5A and 5B are respective frequency response plots for a capacitively and resistively damped integrator.
Figure 5B:
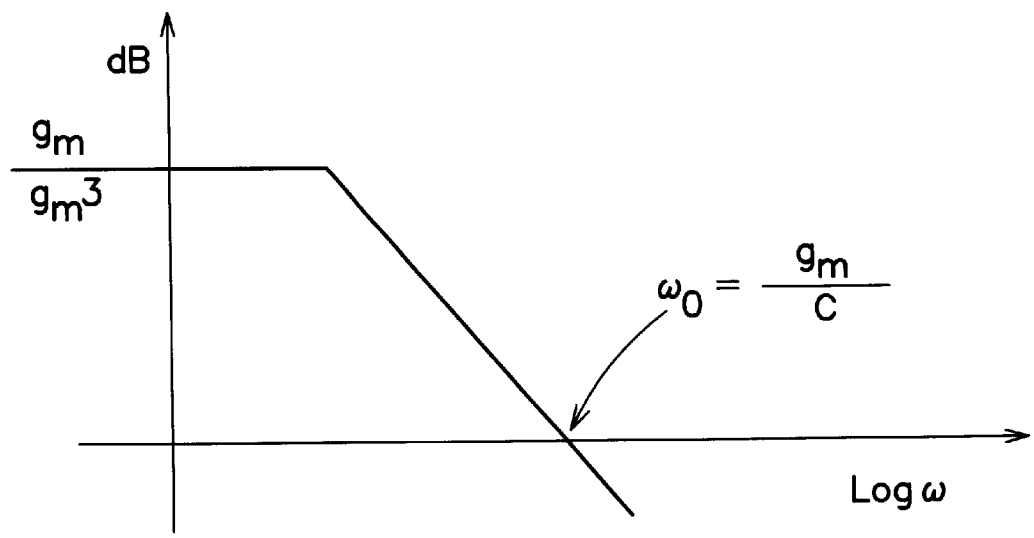

Shown in FIG. 5A is a plot of the frequency response for a capacitively damped integrator according to the invention, and FIG. 5B shows a plot of the frequency response for a resistively damped integrator according to the prior art.

The transfer function of the biquadratic cell 40 in FIG. 4, as simplified by putting gmbip*R>>1, is given by:

$$\frac{vy}{vin} = \frac{-1}{s^2 \cdot C_1 \cdot C_2 \cdot R_1 \cdot R_2 + s \cdot R_1 \cdot C_D + 1} \quad (3.1)$$

$$\frac{vx}{vin} = \frac{s \cdot R_2 \cdot C_1}{s^2 \cdot C_1 \cdot C_2 \cdot R_1 \cdot R_2 + s \cdot R_1 \cdot C_D + 1} \quad (3.2)$$

here, $C_D$ is the value of the damping capacitors CD and CD'. Thus, the biquadratic cell 40 has one output of the low-pass type (O31, O31') and another of a band-pass type (O32, O32').

Using a biquadratic cell such as cell 40 in FIG. 4 to implement a low-pass filter of the seventh order, with a frequency band of 50 MHZ, a reduction in consumption three times as great as that of conventional filters was obtained, while retaining the same harmonic distortion performance for a given dynamic range of the input signal and a given bandwidth.

Modifications and changes may be made to the biquadratic cell of this invention by those skilled in the art without departing from the scope of the present invention. For example, all of the points raised in connection with filters for reading data from bulk memories would apply in practice to any integrated electronic filters of the gm/C type.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An elementary biquadratic cell for programmable time-continuous analog filters, said cell being coupled between a first voltage reference and a second voltage reference and having at least one pair of input terminals and first and second pairs of output terminals, said cell being formed by a pair of half-cells which are structurally identical with each other, each half-cell comprising:

at least a first transistor coupled between the first and the second voltage references and having a base terminal connected to a respective one of the input terminals, each half-cell further comprising second and third transistors coupled between the first and second voltage references, the second transistor having a base terminal connected to a first output terminal of the first pair of output terminals and a collector terminal connected to a first output terminal of the second pair of output terminals; the third transistor having a collector terminal connected to the first output terminal of the first pair of output terminals and a base terminal connected to a second output terminal of the second pair of output terminals;.

wherein the emitter terminal of the first transistor is connected to the emitter terminal of the second transistor through a first resistor.

2. An elementary biquadratic cell according to claim 1, wherein the emitter terminal of the second transistor is connected to the emitter terminal of the third transistor of the other half-cell through a second resistor.

3. The elementary biquadratic cell according to claim 1, wherein the emitter terminal of the first transistor is connected to the emitter terminal of the third transistor through a first resistor.

4. The elementary biquadratic cell according to claim 3, wherein the emitter terminal of the second transistor is coupled to the emitter terminal of the second transistor of the other half-cell through a second resistor.

5. The elementary biquadratic cell according to claim 4, further including a damping capacitor and wherein the emitter terminal of the third transistor is connected to the second voltage reference through a damping capacitor.

6. The elementary biquadratic cell according to claim 2, wherein the first and second pairs of output terminals are connected to the second voltage reference, through respective integration capacitors, and to the first voltage reference (Vdd) through respective bias current generators.

7. The elementary biquadratic cell according to claim 2, wherein the first, second and third transistors have their emitter terminals further connected to the second voltage reference through respective first, second and third bias current generators.

8. The elementary biquadratic cell according to claim 5, wherein the first and second pairs of output terminals are connected to the second voltage reference, through respective integration capacitors, and to the first voltage reference through respective bias current generators.

9. The elementary biquadratic cell according to claim 5, wherein the first and second pairs of output terminals are connected to the second voltage reference through respective bias current generators.

10. An elementary biquadratic cell, said cell having first and second input terminals and first, second, third and fourth output terminals, said cell comprising first and second half cells, said first cell comprising:

a first transistor having a collector terminal coupled to a first supply voltage, an emitter terminal coupled to a second supply voltage and a base terminal coupled to said first input terminal;

a second transistor having a collector terminal coupled to said first output terminal, an emitter terminal coupled to said second supply voltage and a base terminal coupled to said second output terminal; and a third transistor having a collector terminal coupled to said second output terminal, an emitter terminal coupled to said second supply voltage and a base terminal coupled to said third output terminal;

wherein said emitter terminal of said first transistor is connected to said emitter terminal of said second transistor through a first resistor.

11. The elementary biquadratic cell of claim 10, said second half cell comprising:

a fourth transistor having a collector terminal coupled to said first supply voltage, an emitter terminal coupled to said second supply voltage and a base terminal coupled to said second input terminal;

a fifth transistor having a collector terminal coupled to said third output terminal, an emitter terminal coupled to said second supply voltage and a base terminal coupled to fourth output terminal; and a sixth transistor having a collector terminal coupled to said fourth output terminal, an emitter terminal coupled to said second supply voltage and a base terminal coupled to said first output terminal;

wherein said emitter terminal of said fourth transistor is connected to said emitter terminal of said fifth transistor through a third resistor.

12. The elementary biquadratic cell of claim 11, wherein said first, second, third and fourth output terminals are connected to said second supply voltage through a first, second, third and fourth capacitors, respectively.

13. The elementary biquadratic cell of claim 11, wherein said emitter terminal of said first transistor is connected to said emitter terminal of said sixth transistor through said first resistor and second resistor.

14. The elementary biquadratic cell of claim 13, wherein said emitter terminal of said fourth transistor is connected to said emitter terminal of said third transistor through said third resistor and a fourth resistor.

15. The elementary biquadratic cell of claim 11, wherein said first, second, third and fourth output terminals are each connected to said first supply voltage through respective first, second, third and fourth current generators.

16. The elementary biquadratic cell of claim 15, wherein said emitter terminals of said first, second, third, fourth, fifth and sixth transistors are each connected to said second supply voltage through respective first, second, third, fourth, fifth, and sixth current generators.

17. The elementary biquadratic cell of claim 11, wherein said emitter terminal of said first transistor is connected to said emitter terminal of said third transistor through a first resistor, said emitter terminal of said fourth transistor is connected to said emitter terminal of said sixth transistor through a second resistor and said emitter terminal of said second transistor is connected to said emitter terminal of said fifth transistor through third and fourth resistors.

18. The elementary biquadratic cell of claim 17, wherein said emitter terminals of said third and sixth transistors are connected to said second supply voltage through first and second capacitors, respectively.

19. The elementary biquadratic cell of claim 13, wherein said first, second, third and fourth output terminals are connected to said second supply voltage through a first, second, third and fourth capacitors, respectively.

20. The elementary biquadratic cell of claim 19, wherein said first, second, third and fourth output terminals are each connected to said first supply voltage through respective first, second, third, and fourth current generators.

21. The elementary biquadratic cell of claim 20, wherein said emitter terminals of said first, second, third, fourth, fifth and sixth transistors are each connected to said second supply voltage through respective first, second, third, fourth, fifth and sixth current generators.

22. The elementary biquadratic cell of claim 17, wherein said first, second, third and fourth output terminals are each connected to said first supply voltage through a first, second, third and fourth capacitors, respectively.

23. The elementary biquadratic cell of claim 22, wherein said first second, third and fourth output terminals are each connected to said first supply voltage through respective first, second, third, and fourth current generators.

24. The elementary biquadratic cell of claim 23, wherein said emitter terminals of said first, second, third, fourth, fifth and sixth transistors are each connected to said second supply voltage through respective first, second, third, fourth, fifth and sixth current generators.

25. An elementary biquadratic cell for programmable time-continuous analog filters, said cell comprising a pair of input terminals for receiving an input signal and first and second pairs of output terminals, wherein an output at said first pair of output terminals is of a low-pass type and an output at said second pair of output terminals is of a band pass type.

wherein said cell comprises a first half cell and a second half-cell, wherein said first half-cell comprises a first input terminal of said pair of input terminals, a first output terminal of said first pair of output terminals and a first output terminal of said second pair of output terminals; and wherein said second half-cell comprises a second input terminal of said pair of input terminals, a second output terminal of said first pair of output terminals and a second output terminal of said second pair of output terminals;

said first half-cell further comprising:
  a first transistor coupled between a first voltage supply and a second voltage supply and having a first terminal connected to said first input terminal;
  a second transistor coupled between said first voltage supply and said second voltage supply and having a first terminal connected to said first output terminal of said first pair of output terminals; and
  a third transistor coupled between said first voltage supply and said second voltage supply and having a first terminal connected to said second output terminal of said second pair of output terminals;

wherein said emitter terminal of said first transistor connected to said emitter terminal of said second transistor through a first resistor.

26. The elementary biquadratic cell of claim 25, said second half-cell further comprising:
  a fourth transistor coupled between said first voltage supply and said second voltage supply and having a first terminal connected to said second input terminal;
  a fifth transistor coupled between said first voltage supply and said second voltage supply and having a first terminal connected to said second output terminal of said first pair of output terminals; and
  a sixth transistor coupled between said first voltage supply and said second voltage supply and having a first terminal connected to said first output terminal of said second pair of output terminals;

wherein said emitter terminal of said fourth transistor is connected to said emitter terminal of said fifth transistor through a third resistor.

27. The elementary biquadratic cell of claim 26, wherein each of said second, third, fifth and sixth transistors are coupled to said first voltage supply through respective first, second, third, and fourth current generators.

28. The elementary biquadratic cell of claim 27, wherein each of said first, second, third, fourth, fifth and sixth transistors are coupled to said second voltage supply through respective fifth, sixth, seventh, eighth, ninth and tenth current generators.

29. The elementary biquadratic cell of claim 26, wherein each of said output terminals of said first and second pairs of output terminals are connected to said second voltage supply through respective capacitors.

30. The elementary biquadratic cell of claim 26, wherein a second terminal of said third transistor is connected to said second voltage supply through a first capacitor and a second terminal of said sixth transistor is connected to said second voltage supply through a second capacitor.

31. The elementary biquadratic cell of claim 30, wherein a second terminal of said second transistor is connected to a second terminal of said fifth transistor through at least one resistor.

* * * * *

UNITED STATES PATENT AND TRADEMARK OFFICE
CERTIFICATE OF CORRECTION

PATENT NO. : 6,239,653 B1
DATED : May 29, 2001
INVENTOR(S) : Frencesco Rezzi, Rinaldo Castello, Marco Cazzaniga, Ivan Bietti It is certified that error appears in the above-identified patent and that said Letters Patent is hereby corrected as shown below:

<u>Title page,</u> items [73] and [74] should read:
Item [73] Assignee: SGS-Thomson Microelectronics S.r.l., Agrate Brianza, Italy

Item [74] Attorney, Agent, or Firm – Wolf, Greenfield & Sacks, P.C., James H. Morris; Theodore E. Galanthay

Signed and Sealed this

Eighteenth Day of September, 2001

*Attest:*

NICHOLAS P. GODICI
*Attesting Officer*     *Acting Director of the United States Patent and Trademark Office*